United States Patent
Velichko et al.

(10) Patent No.: US 9,105,546 B2
(45) Date of Patent: Aug. 11, 2015

(54) IMAGING SYSTEMS WITH BACKSIDE ILLUMINATED NEAR INFRARED IMAGING PIXELS

(71) Applicant: Semiconductor Components Industries, LLC, Phoenix, AZ (US)

(72) Inventors: Sergey Velichko, Boise, ID (US); Gennadiy Agranov, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/954,844

(22) Filed: Jul. 30, 2013

(65) Prior Publication Data

US 2014/0077323 A1    Mar. 20, 2014

Related U.S. Application Data

(60) Provisional application No. 61/703,130, filed on Sep. 19, 2012.

(51) Int. Cl.
*H01L 31/0232* (2014.01)
*H01L 27/146* (2006.01)

(52) U.S. Cl.
CPC ........ *H01L 27/1464* (2013.01); *H01L 27/1463* (2013.01); *H01L 27/14627* (2013.01); *H01L 27/14629* (2013.01); *H01L 27/14683* (2013.01); *H01L 27/14689* (2013.01)

(58) Field of Classification Search
USPC ............ 257/362, 431, 432, E27.112; 438/69, 438/71, 72
See application file for complete search history.

(56) References Cited

U.S. PATENT DOCUMENTS

| | | | |
|---|---|---|---|
| 6,498,530 B1 | 12/2002 | Tang | |
| 7,425,460 B2 | 9/2008 | Pain | |
| 8,119,439 B2 * | 2/2012 | Park | 438/72 |
| 8,354,282 B2 | 1/2013 | Stern | |
| 2008/0277693 A1 * | 11/2008 | Mauritzson et al. | 257/205 |
| 2010/0258855 A1 * | 10/2010 | Yilmaz et al. | 257/328 |
| 2011/0266645 A1 * | 11/2011 | Chao | 257/432 |
| 2012/0235266 A1 * | 9/2012 | Ootsuka | 257/432 |
| 2012/0248560 A1 * | 10/2012 | Lee et al. | 257/432 |

* cited by examiner

*Primary Examiner* — Phuc Dang
(74) *Attorney, Agent, or Firm* — Treyz Law Group; Joseph F. Guihan; Michael H. Lyons

(57) ABSTRACT

An imaging system may include an image sensor having backside illuminated near infrared image sensor pixels. Each pixel may be formed in a graded epitaxial substrate layer such as a graded n-type epitaxial layer. Each pixel may be separated from an adjacent pixel by an isolation trench formed in the graded epitaxial layer. The isolation trench may be a continuous isolation trench or may be formed from a combined front side isolation trench and backside isolation trench that are separated by a wall structure. A buried front side reflector may be provided that reflects light such as infrared light that has passed through a pixel back into the pixel, thereby effectively doubling the silicon absorption depth of the pixels.

14 Claims, 3 Drawing Sheets

IMAGING SYSTEMS WITH BACKSIDE ILLUMINATED NEAR INFRARED IMAGING PIXELS

This application claims the benefit of provisional patent application No. 61/703,130, filed Sep. 19, 2012, which is hereby incorporated by reference herein in its entirety.

BACKGROUND

This relates generally to imaging systems, and more particularly, to imaging systems with backside illuminated near infrared image pixels.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

In some situations, it is desirable to capture images using infrared light in addition to or separately from, images captured using visible light. However, typical image pixels that are formed in a silicon substrate can have limited infrared imaging capability due to the relatively low absorption of near-infrared (NIR) light in silicon. Additionally, NIR photons penetrate deeper into a silicon substrate and can generate pixel crosstalk which results in lower image sharpness in existing sensors in response to NIR light.

It would therefore be desirable to be able to provide improved imaging systems for capturing infrared images.

DETAILED DESCRIPTION

Electronic devices such as digital cameras, computers, cellular telephones, and other electronic devices include image sensors that gather incoming image fight tea capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry fir operating the imaging pixels and readout circuitry for reading out image signals corresponding to the electric charge generated by the photosensitive elements.

An image sensor may include imaging pixels configured to respond to various colors of light. As examples, an image sensor may include red image pixels, blue image pixels, clear image pixels, green image pixels, yellow image pixels, and/or infrared image pixels such as near infrared image pixels. Near infrared image pixels may include an infrared color filter element that blocks or absorbs visible light while passing near infrared light onto photosensitive regions of the near infrared pixel. The image pixels in the image sensor may be backside illuminated (BSI) image pixels.

Figure 1:
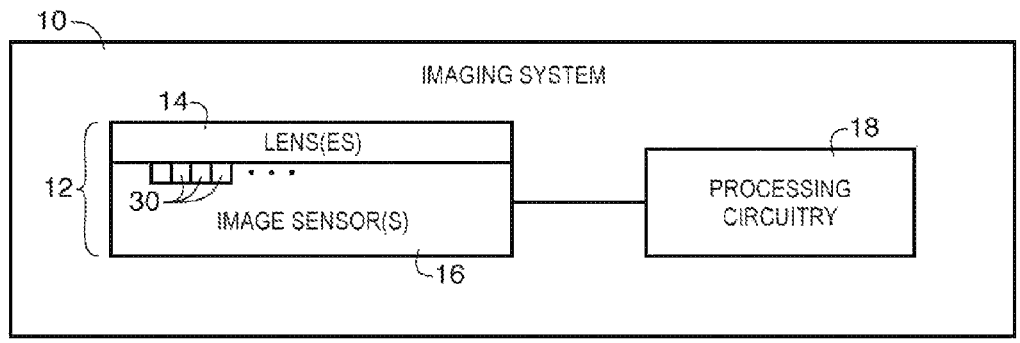
FIG. 1 is a diagram of an illustrative imaging system that may include a camera module having an image sensor with backside illuminated infrared image pixels in accordance with an embodiment of the present invention.

FIG. 1 is a diagram of an illustrative imaging system that uses an image sensor having backside illuminated near infrared image pixels to capture images. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor integrated circuit die with an array of image pixels 30. Image pixels 30 may include one or more backside illuminated (BSI) infrared image sensor pixels (sometimes referred to herein as backside illuminated near infrared image pixels, backside illuminated image pixels, image pixels, or pixels). Image sensor 16 may include one or more arrays of image pixels 30 such as red image pixels, blue image pixels, clear image pixels, green image pixels, yellow image pixels, and/or near infrared image pixels.

During image capture operations, light from a scene may be focused onto an image pixel array on image sensor 16 by lens 14. Image sensor 16 provides corresponding digital image data to control circuitry such as processing circuitry 18.

Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g. a computer or other device) using wired and or wireless communications paths coupled to processing circuitry 18. Processing circuitry 18 may be used in controlling the operation of image sensors 16.

Figure 2:
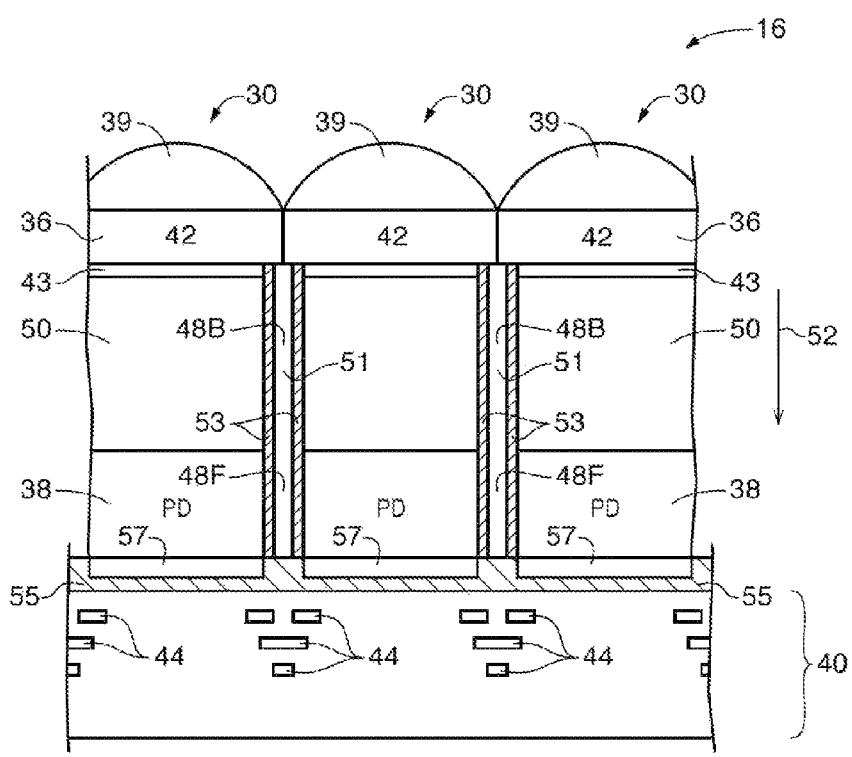
FIG. 2 is a cross-sectional side view of illustrative backside illuminated infrared image pixels that are formed in a graded n-type epitaxial substrate in accordance with an embodiment of the present invention.

FIG. 2 is a cross-sectional side view of a portion of image sensor 16 that includes backside illuminated (BSI) infrared image sensor pixels 30. As shown in FIG. 2, each BSI image pixel 30 may include a photosensitive element such as one of photodiodes 38 formed in a substrate such as substrate layer 50 (e.g., an active n-type epitaxial substrate). Substrate layer 50 may be a graded n-type epitaxial layer (sometimes referred to herein as a graded n-epi substrate) in which the concentration of n-type dopants increases toward the front side of sensor 16 in the direction of arrow 52.

In order to provide effective NIR photon generated charge collection and transfer of the generated charges to the surface of photodiodes (PDs) 38 and to provide effective suppression of optical and electrical pixel crosstalk, graded n-epi substrate 50 may include deep trench pixel isolation using trenches such as backside trenches 48B and frontside trenches 48F. In some configurations a p-type doped region such as p-type wall 51 (e.g., a portion of a deep implanted p-well, that remains after trench formation processes) may be formed between each frontside trench 48F and an associated backside trench 48B. However, this is merely illustrative. If desired, trenches 48B and 48F may form a continuous trench that completely separates adjacent pixels 30. Trenches 48B and 48F may be filled with a filler material such as an oxide material (e.g., silicon oxide).

In general, pixels 30 may be separated by a backside trench 48B without any frontside trench, a frontside trench 48F and a deep p-well in the place of backside trench 48B, a continuous trench that extends from the frontside to the backside of substrate 50, or a frontside trench 48 and a backside trench 48B separated by p-type structure 50 as shown in FIG. 2. Passivation layer 53 may be formed on sidewall surfaces of trenches 48B and 48F. Passivation layer 53 may be formed in to deep p-well implantation process within frontside trench 48F.

As shown in FIG. 2, each pixel 30 may include a photodiode 38 formed in substrate 50, a color filter element 36 and a microlens 39. Each microlens 39 may focus image light such through an associated color filter element 36 and onto the photodiode 38 of that pixel.

Trenches 48F and 48B may be formed using very deep trench isolation (VDTI) processes. Trenches 48F and 48B may provide optical isolation between adjacent pixels 30 to the depth of the VDTI trenches. VDTI trenches may be completely filled with material such as silicon oxide or, if desired, some an may be left in the VDTI trench between sidewalk of the trench to further optically isolate pixels 30 from each other.

Image sensor 16 may include a reflector structure such as front side reflector 55 formed on the front side of substrate 50. Dielectric material 57 may be formed over photodiodes 38 before forming reflector 55 so that dielectric material 57 is interposed between reflector 55 and photodiodes 38. Reflector 55 may be a buried light shield reflector formed from metal such a metal buried light shield reflector. Reflector 55 metal material may be (for example) tungsten, aluminum, or copper.

As shown in FIG. 2 dielectric stack 40 may be formed on the front surface of substrate 50 (e.g. on reflector 55). Dielectric stack 40 may have alternating layers of metal 44 and dielectric material 42. Metal interconnects 44 may be patterned metal layers within in dielectric stack 40. Metal interconnects 44 may be formed from a suitable metal such as copper or aluminum. Dielectric stack 40 may include metal vias. Dielectric stack may have, for example, two or more metal layers, for or more metal layers, six or more metal layers, or other suitable numbers of metal layers. Dielectric stack 40 may also be known as interlayer dielectric (ILD). Metal layer and is layers may be known as interconnect layers. Reflector 55 may be formed as a portion to (e.g., a metal layer) of dielectric stack 40 or may be formed separately from dielectric stack 40.

If desired, reflector 55 may also be configured to provide an electrical contact such as a pixel grounding contact for pixels 30. However, this is merely illustrative, if desired, reflector 55 may be electrically isolated from pixels 30 by dielectric material 57 or other material.

In a configuration of the type shown in FIG. 2, photodiodes 38 may include a p-n junction at a depth of between 6 microns and 8 microns (for example) from the frontside of substrate 50. Light that haw passed through photodiodes 38 may be reflected from reflector 55 back onto photodiodes 38 so that reflector 55 effectively doubles the absorption depth of each pixel, resulting in an absorption depth of to up to 16 microns or more.

Material such as passivation material 43 may be formed between graded epi substrate 34 and optical elements such as color filter elements 36 and microlenses 39. Passivation material may include a high concentration of p-type dopants. Material 43 may be a thinned portion of a graded p-type epitaxial substrate layer.

Figure 3:
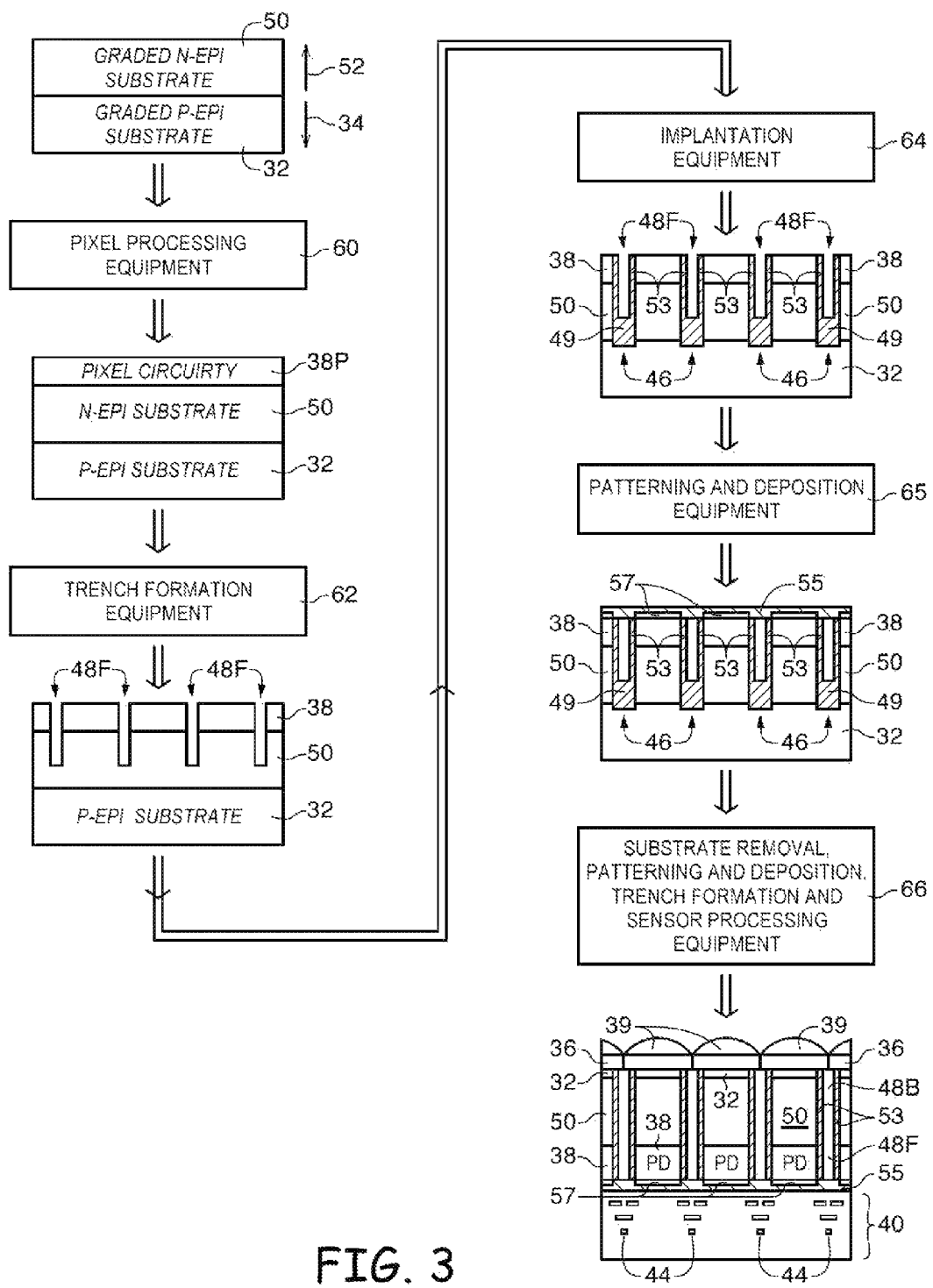
FIG. 3 is a flow diagram showing illustrative steps that may be involved in forming backside illuminated infrared image pixels in a graded n-type epitaxial substrate in accordance with an embodiment of the present invention.

FIG. 3 is a flow diagram showing illustrative steps that may be used in the formation of an image sensor of the type shown in FIG. 2. As shown in FIG. 3 a substrate such as a silicon substrate having at least a portion with a graded p-epi layer 32 and a graded n-epi layer 50 may be provided to pixel processing equipment 60. Layer 32 may include a concentration of p-type carriers that increases in the direction of arrow 34. Layer 50 may include a concentration of n-type carriers that increases in the direction of arrow 52.

Pixel processing equipment 60 (e.g., deposition equipment, patterning equipment, implantation equipment, annealing equipment, or other suitable equipment for forming pixel components such as photodiodes and transistors in a silicon substrate) may be used to form pixel circuitry 38P (e.g., a blanket pinned photodiode implantation) in graded n-epi substrate layer 50. Blanket photodiode 38P may be located in part by implanting a high concentration of n-type dopants as deep as possible in graded n-epi substrate layer 50.

Trench formation equipment 62 (e.g., masking equipment, etching equipment, etc.) may be used to perform very deep trench isolation (VDTI) operations to form front side trenches 48F in substrate layer 50 in which blanket photodiode 38P has been formed, thereby isolating photodiodes 38 of each individual pixel.

Without filling trenches 48F, implantation equipment 64 may be used to implant very deep p-wells 49 in front side trenches 48F in layer 50. Deep p-well implantation operations may also form passivation layers 53 on the sidewalls of frontside trenches 48F. P-wells 49 may extend to the interface between p-epi layer 32 and n-epi layer 50 or may extend partially into p-epi layer 32 from n-epi layer 50.

Sensor processing equipment 65 may be used to fill trenches 48F with a filler material such as an oxide material (e.g., by filling trenches 48F with an oxide material such as silicon oxide in the presence of hydrogen and deuterium).

Patterning and deposition equipment 65 may then be used to form pixel gates and dielectric material 57 and front side reflector 55 on substrate 50 over photodiodes 38. For example, a layer of dielectric material may be deposited over photodiodes 38 and patterned. Metal may then be formed on the patterned dielectric material to form reflector 55.

Additional equipment such as substrate removal, patterning and deposition, trench formation, and sensor processing equipment 66 may then be used to form dielectric stack 40 with metal interconnected layers 44 over reflector 55, then to backgrind graded p-epi layer 32 to a desired thickness, form backside trenches 48B in p-wells 49, fill trenches 48B with a filler material such as an oxide material (e.g., by filling the trenches with an oxide material such as silicon oxide in the presence of hydrogen and deuterium), and form color filter elements 36 and/or microlenses 39 the backside of substrate 50 or on a thinned portion of p-epi layer 32 that remains on the backside of substrate 50) to form image sensor 16.

Forming backside trenches 48B in p-wells 49 may include performing very deep trench isolation (VDTI) operations that form backside trenches 48B that extend through to front-side trenches 48F, that leave a portion of p-wells 49 (e.g., portions 51 of FIG. 2 between trenches 48F and 48B), or that form backside trenches having configurations that are different from the configuration of front side trenches 48F.

For example, because front side trenches 48F may be configured to allow for pixel circuitry elements on the front side of sensor 16 and because this type of element may be reduced or non-existent near the backside of sensor 16, backside trenches 48B may be wider, more continuous, more abundant, or otherwise different from front side trenches 48. However, this is merely illustrative. If desired, backside trenches 48B may be configured to substantially mirror the configuration of front side trenches 48F.

Formation of image sensor 16 having BSI infrared pixels 30 may include other steps commonly known in the art (e.g., forming polysilicon gates, metal layers and interconnects, attaching permanent and/or temporary carrier substrates, removing temporary carrier substrates, forming through silicon vias, etc.).

The configuration described above, in connection with FIGS. 2 and 3 in which photon-generated electrons accumulate in photodiodes formed in graded n-epi and p-epi substrates with deep trench and deep p-well isolation between the photodiodes are merely illustrative. If desired, pixels 30 may collect photon-generated holes in photodiodes formed in graded p-epi substrates in which the concentration of p-type dopants increases toward the surface of the silicon and in which deep trench and deep n-well isolation structures are formed between the photodiodes. In another example, hole collecting photodiodes with very deep p-n junctions may be formed in a graded p-epi substrate that is formed on a top of a graded n-epi substrate in which the concentration of p-type dopants in the p-epi substrate increases toward the surface of the silicon and the concentration of n-type dopants in the graded n-epi substrate increases toward the backside of the silicon and in which deep trench and deep n-well isolation structures between the photodiodes extend up to or beyond the interface between the graded p-epi and the n-epi substrates.

Figure 4:
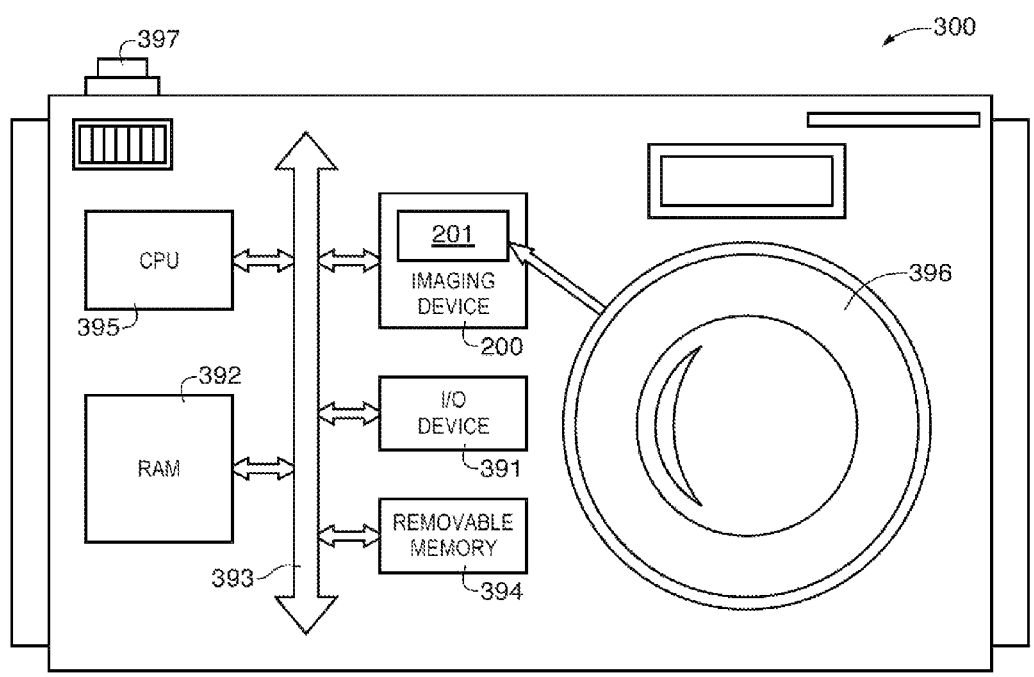
FIG. 4 is a block diagram of an imager employing the embodiments of FIGS. 1-3 in accordance with an embodiment of the present invention.

FIG. 4 shows in simplified form a typical processor system 300, such as a digital camera, which includes an imaging device 200. Imaging device 200 may include a pixel array 201 (e.g., an array of image sensor pixels such as backside illuminated near infrared pixels 30 of FIG. 2). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 39 over bus 393. Imaging, device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having image sensors with arrays of backside illuminated (BSI) near infrared image sensor pixels. Each BSI near infrared image sensor pixel may be formed in a graded epitaxial substrate layer such as a combined graded n-type epitaxial substrate layer. Each backside illuminated near infrared pixel may be separated from an adjacent backside illuminated near infrared pixel by a front side deep isolation trench and/or a backside deep isolation trench formed in the graded epitaxial substrate layer. During manufacturing, a deep p-well may be formed within each front side isolation trench (e.g., at the bottom of the trench). The backside isolation trenches may be formed in the deep p-wells that have been formed in the front side trenches.

A reflective layer such as a buried metal reflector may be funned between the pixels and a dielectric stack formed on the front side of the sensor. Light that enters a pixel and passes through a photodiode without being absorbed may be later absorbed after being reflected from the buried metal reflector back into the pixel.

The glided n-epi layer may have an increasing concentration of n-type carriers that increases toward the front side of the image sensor. For example, the concentration of n-type dopants may increase with increasing distance from microlenses associated with the pixels.

The isolation trenches may be formed by forming a trench in the graded n-type epitaxial substrate layer using very deep trench isolation techniques and, before filling the trenches, implanting p-type dopants into each trench using deep p-well implantation techniques, flipping the substrate, backgrinding the p-epi substrate, forming additional trenches in the implanted p-type dopant region, and filling the additional trenches.

The foregoing is merely illustrative of the principles of this invention which can be practiced in other embodiments.

What is claimed is:

1. An image sensor, comprising:
   a graded n-type epitaxial substrate layer;
   a plurality of photodiodes formed in the graded n-type epitaxial substrate layer;
   a plurality of isolation trenches in the graded n-type epitaxial substrate layer that separate adjacent photodiodes;
   a reflective layer; and
   a dielectric stack on the reflective layer, wherein the reflective layer is interposed between the plurality of photodiodes and the dielectric stack.

2. The image sensor defined in claim 1 wherein each isolation trench comprises a backside isolation trench that extends from a back side of the graded n-type epitaxial substrate layer into the graded n-type epitaxial substrate layer.

3. The image sensor defined in claim 1 wherein each isolation trench comprises a front side isolation trench that extends from a front side of the graded n-type epitaxial substrate layer into the graded n-type epitaxial substrate layer.

4. The image sensor defined in claim 3, further comprising:
   a p-well formed in each front side isolation trench.

5. The image sensor defined in claim 1 wherein each isolation trench comprises a backside isolation trench that extends from a back side of the graded n-type epitaxial substrate layer into the graded n-type epitaxial substrate layer and a corresponding front side isolation trench that extends from a front side of the graded n-type epitaxial substrate layer into the graded n-type epitaxial substrate layer in the direction of the backside isolation trench.

6. The image sensor defined in claim 5 wherein the backside isolation trench extends through to the front side isolation trench forming a continuous isolation trench that extends from the front side of the graded n-type epitaxial substrate layer to the backside of the graded n-type epitaxial substrate layer.

7. The image sensor defined in claim 5, further comprising:
a structure between the front side isolation trench and the backside isolation trench.

8. The image sensor defined in claim 1 wherein the graded n-type epitaxial substrate layer includes n-type carriers in a concentration that increases with increased distance from a backside of the graded n-type epitaxial substrate layer.

9. An image sensor, comprising:
a graded n-type epitaxial substrate layer;
a plurality of photodiodes formed in the graded n-type epitaxial substrate layer;
a plurality of isolation trenches in the graded n-type epitaxial substrate layer that separate adjacent photodiodes;
a reflective layer; and
a dielectric stack on the reflective layer, wherein the reflective layer is interposed between the plurality of photodiodes and the dielectric stack wherein each isolation trench comprises a backside isolation trench that extends from a back side of the graded n-type epitaxial substrate layer into the graded n-type epitaxial substrate layer and a front side isolation trench that extends from a front side of the graded n-type epitaxial substrate layer into the graded n-type epitaxial substrate layer and wherein the configuration of the backside isolation trench is different from the configuration of the front side isolation trench.

10. A system, comprising:
a central processing unit;
memory;
input-output circuitry; and
an imaging device, wherein the imaging device comprises:
a graded epitaxial substrate layer; and
an array of backside illuminated near infrared pixels in the graded epitaxial substrate layer, wherein each backside illuminated near infrared pixel is separated from an adjacent backside illuminated near infrared pixel by a deep isolation trench formed in the graded epitaxial substrate layer, and wherein the graded epitaxial substrate layer includes carriers in a concentration that increases with increased distance from a backside of the graded epitaxial substrate layer.

11. The system defined in claim 10 wherein each deep isolation trench comprises a front side isolation trench.

12. The system defined in claim 10 wherein each deep isolation trench comprises a backside isolation trench.

13. The system defined in claim 10 wherein each deep isolation trench comprises a front side isolation trench and an associated backside isolation trench.

14. The system defined in claim 10 wherein each backside illuminated near infrared pixel further comprises a front side reflector.

* * * * *